(12) United States Patent
Onozeki et al.

(10) Patent No.: US 10,051,743 B2
(45) Date of Patent: Aug. 14, 2018

(54) TWO-LAYERED LAMINATE HAVING METAL FOIL CLADDED ON ITS ONE SURFACE, METHOD FOR PRODUCTION OF THE LAMINATE, SINGLE-SIDED PRINTED WIRING BOARD, AND METHOD FOR PRODUCTION OF THE WIRING BOARD

(75) Inventors: Hitoshi Onozeki, Ibaraki (JP); Takahiro Tanabe, Tochigi (JP); Kiyoshi Saitou, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 348 days.

(21) Appl. No.: 12/935,668

(22) PCT Filed: Apr. 4, 2008

(86) PCT No.: PCT/JP2008/056790
§ 371 (c)(1),
(2), (4) Date: Dec. 16, 2010

(87) PCT Pub. No.: WO2009/122589
PCT Pub. Date: Oct. 8, 2009

(65) Prior Publication Data
US 2011/0108310 A1     May 12, 2011

(30) Foreign Application Priority Data

Apr. 4, 2008  (JP) .................................. 2008-097808

(51) Int. Cl.
*H05K 1/09* (2006.01)
*H05K 3/02* (2006.01)
(Continued)

(52) U.S. Cl.
CPC ........... *H05K 3/022* (2013.01); *H05K 3/0097* (2013.01); *H05K 3/06* (2013.01); *H05K 3/244* (2013.01);
(Continued)

(58) Field of Classification Search
CPC ........ H05K 3/0052; H05K 3/02; H05K 3/022; H05K 3/048; H05K 3/0097; H05K 3/046
(Continued)

(56) References Cited

U.S. PATENT DOCUMENTS 4,086,375 A * 4/1978 LaChapelle, Jr. ..... H01L 21/033
216/102
5,175,047 A * 12/1992 McKenney .......... H05K 3/4691
174/250
(Continued)

FOREIGN PATENT DOCUMENTS

JP       07-302977      11/1995
JP       2001-308548    11/2001
(Continued)

OTHER PUBLICATIONS

Furukawa et al., JP 07-302977, Nov. 14, 1995 (Machine Translation).*

*Primary Examiner* — Tremesha S Willis
(74) *Attorney, Agent, or Firm* — Fitch, Even, Tabin & Flannery, L.L.P.

(57) ABSTRACT

Provided are a metal foil single-clad two-ply laminate which comprises two pairs of structures each comprising one prepreg or a laminate of two or more prepregs cladded with a metal foil on one surface thereof, wherein the two pairs of structures are laminated on each other through thermal compression via a release material put therebetween so that each prepreg faces inward, and wherein the release material is a film of a resin material or the like and its thickness is from 10 to 200 μm, and the thermal shrinkage of the release material at the temperature of the thermal compression treatment is at most 1.5%; and a method for producing the laminate. Also disclosed are a single-sided printed wiring board and its production method using the metal foil single-clad two-ply laminate.

29 Claims, 1 Drawing Sheet

(51) Int. Cl.
  *H05K 3/00* (2006.01)
  *H05K 3/06* (2006.01)
  *H05K 3/24* (2006.01)

(52) U.S. Cl.
  CPC ............... *H05K 2201/0355* (2013.01); *H05K 2203/1536* (2013.01); *Y10T 29/49124* (2015.01); *Y10T 428/269* (2015.01)

(58) Field of Classification Search
  USPC ........................................................ 174/257
  See application file for complete search history.

(56) References Cited

U.S. PATENT DOCUMENTS

| | | | |
|---|---|---|---|
| 6,850,310 B1* | 2/2005 | Prechtl | C09B 67/0098 349/185 |
| 2001/0027875 A1 | 10/2001 | Kim et al. | |
| 2003/0178139 A1* | 9/2003 | Clouser et al. | 156/330 |
| 2007/0069393 A1* | 3/2007 | Asahi et al. | 257/780 |
| 2007/0079987 A1* | 4/2007 | Yamamichi et al. | 174/260 |
| 2007/0194311 A1* | 8/2007 | Kojima et al. | 257/57 |
| 2008/0090330 A1* | 4/2008 | Terui | 438/109 |
| 2008/0127479 A1* | 6/2008 | Naritomi et al. | 29/527.4 |

FOREIGN PATENT DOCUMENTS

| | | |
|---|---|---|
| JP | 2004-255705 | 9/2004 |
| JP | 2005-302997 | 10/2005 |
| JP | 2007-090581 | 4/2007 |

\* cited by examiner

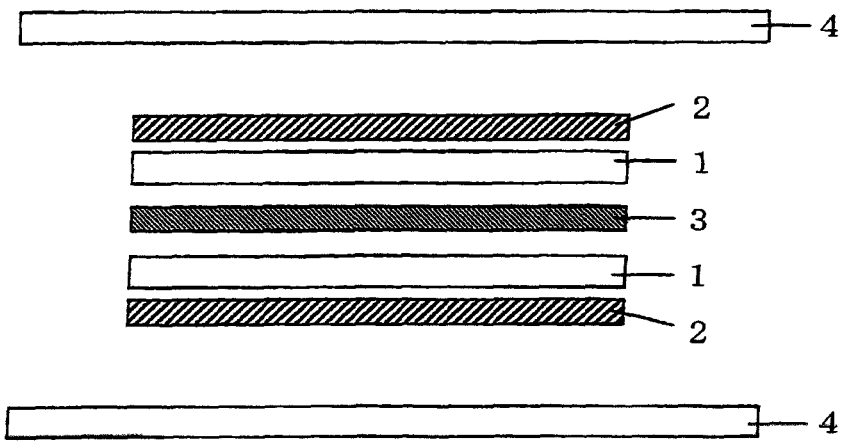

TWO-LAYERED LAMINATE HAVING METAL FOIL CLADDED ON ITS ONE SURFACE, METHOD FOR PRODUCTION OF THE LAMINATE, SINGLE-SIDED PRINTED WIRING BOARD, AND METHOD FOR PRODUCTION OF THE WIRING BOARD

TECHNICAL FIELD

The present invention relates to a metal foil single-clad two-ply laminate and its production method, as well as to a single-sided printed wiring board and its production method, and in particular, relates to a metal foil single-clad two-ply laminate and its production method applicable to multilayer wiring boards, semiconductor chip-mounted substrates, semiconductor package substrates and the like, as well as to a single-sided printed wiring board and its production method using the metal foil single-clad two-ply laminate.

BACKGROUND ART

Heretofore, many metal foil single-clad laminates for use for BOC (board on chip) substrates and the like are produced as follows: First, a necessary number of prepregs are laminated to give a laminate. With that, a metal foil is cladded on both sides thereof to give a metal foil double-clad laminate. Subsequently, only one side of the metal foil double-clad laminate is etched to remove the copper foil to give a metal foil single-clad laminate. The process has a problem in that the copper foil on one side is inevitably wasted.

For efficiently producing a metal foil single-clad laminate, there is proposed a method comprising cladding a predetermined number of prepregs and a metal foil on both sides of a release material and pressing them under heat to give a metal foil single-clad two-ply laminate, followed by separating the laminate into two (for example, see Patent Reference 1). Also proposed is a method of using a release film to enhance the releasability from a substrate for efficiently producing a metal foil single-clad laminate (for example, see Patent Reference 2). Further proposed is a method of using two copper-clad laminates, wherein a prepreg and a film smaller than the copper-clad laminate and not mutually adhering to the copper-clad laminate are put between the two copper-clad laminates and pressed under heat to give a pseudo-laminate, and the two are peeled after worked for circuit formation thereon (for example, see Patent Reference 3).

[Patent Reference 1] JP-A 7-302977
[Patent Reference 2] JP-A 2007-90581
[Patent Reference 3] JP-A 2001-308548

DISCLOSURE OF THE INVENTION

Problems that the Invention is to Solve

As in Patent Reference 1, in case where the metal foil single-clad two-ply laminate is, before separated into the individual sheets, worked on both sides thereof for circuit formation, solder resist application, Ni—Au plating, external configuration formation and the like, the working efficiency could be good. However, in this, aluminium is used as the release material, and therefore, when the two-ply laminate is worked as such, then the chemical for the working treatment would penetrate into the cladding face between one sheet and the release material of the metal foil single-clad two-ply laminate (this is hereinafter referred to as "cladding face"). In this case, a step of washing off the adhering chemical ingredients could be provided; however, the chemical liquid having penetrated into the cladding face is difficult to remove by ordinary washing. Accordingly, the chemical liquid may remain and bring about a problem in that it may contaminate a chemical liquid for use in other treatment. In working for circuit formation, there is another problem in that aluminium of the release material may dissolve.

As in Patent Reference 2, in case where a release film is used as the release material, it could solve the above-mentioned problems of chemical penetration and release material dissolution. However, in a step of curing a solder resist at a high temperature, there may occur a problem of peeling at the cladding face owing to the shrinkage of the release film.

As in the Patent Reference 3, in the method where two copper-clad laminates are used and where a prepreg and a film smaller than the copper-clad laminate and not mutually adhering to the copper-clad laminate are put between the two copper-clad laminates, the entire surface of the support substrate could not be worked for circuit formation thereon and therefore the process efficiency is poor. In addition, in this, in case where the film is misaligned, good products could not be obtained and the percent defective would increase.

From the above, an object of the present invention is to provide a metal foil single-clad two-ply laminate and its production method, in which the chemicals used in the production process are free from penetration, the releasability of the release material is good, and there occurs no problem of peeling at the cladding face owing to the shrinkage of the release film in high-temperature treatment. Another object is to provide a single-sided printed wiring board and its production method using the metal foil single-clad two-ply laminate.

Means for Solving the Problems

The above-mentioned problems can be solved by the present invention described below. Specifically, the present invention is a metal foil single-clad two-ply laminate which comprises two pairs of structures each comprising one prepreg or a laminate of two or more prepregs cladded with a metal foil on one surface thereof, wherein the two pairs of structures are laminated on each other through thermal compression via a release material put therebetween so that each prepreg faces inward, and wherein the release material is a film of a resin material or a composite material of a resin material combined with a metal material and its thickness is from 10 to 200 μm, and the thermal shrinkage of the release material at the temperature of the thermal compression treatment is at most 1.5%.

The present invention is also a method for producing a metal foil single-clad two-ply laminate, which comprises cladding one prepreg or a laminate of two or more prepregs with a metal foil on one surface thereof to prepare a structure, and laminating two pairs of the structures on each other through thermal compression via a release material put therebetween so that each prepreg faces inward, and wherein the release material is a film of a resin material or a composite material of a resin material combined with a metal material and its thickness is from 10 to 200 μm, and the thermal shrinkage of the release material at the temperature of the thermal compression treatment is at most 1.5%.

The present invention is also a single-sided printed wiring board produced by processing both surfaces of the metal foil single-clad two-ply laminate for circuit formation, solder resist application, Ni—Au plating and external configuration formation or for at least any one of those treatments, followed by separating the two pairs of metal foil single-clad laminates individually from the release material.

The present invention is also a method for producing a single-sided printed wiring board, which comprises processing both surfaces of the metal foil single-clad two-ply laminate for circuit formation, solder resist application, Ni—Au plating and external configuration formation or for at least any one treatment of those treatments, followed by separating the two pairs of metal foil single-clad laminates individually from the release material.

Advantage of the Invention

According to the present invention, there are provided a metal foil single-clad two-ply laminate and its production method, in which the chemicals used in the production process are free from penetration, the releasability of the release material is good, and there occurs no problem of peeling at the cladding face owing to the shrinkage of the release film in high-temperature treatment. According to the present invention, there are also provided a single-sided printed wiring board and its production method using the metal foil single-clad two-ply laminate.

BRIEF DESCRIPTION OF THE DRAWING

FIG. 1 It is a schematic explanatory view showing one example of the production method for a metal foil single-clad two-ply laminate of the present invention. 1 is a prepreg, 2 is a metal foil, 3 is a release material, 4 is a mirror plate.

BEST MODE FOR CARRYING OUT THE INVENTION

[1] Metal Foil Single-Clad Two-Ply Laminate:

The metal foil single-clad two-ply laminate of the present invention comprises two pairs of structures each comprising one prepreg or a laminate of two or more prepregs cladded with a metal foil on one surface thereof, wherein the two pairs of structures are laminated on each other through thermal compression via a release material put therebetween so that each prepreg faces inward.

The metal foil single-clad two-ply laminate of the present invention is described below.
(Release Material)

The release material for use in the present invention is so designed that, in a production process for a printed wiring board through thermal compression, it adheres to the prepreg without peeling by itself while on the other hand, when intentionally peeled, the prepreg can be easily peeled from the metal foil single-clad two-ply laminate by hand. The release material is a film of a resin material or a composite material of a resin material combined with a metal material. When the release material is formed of a metal material alone, it may tend to induce penetration of various chemical liquids in the production process of a wiring board, but when the release material is formed of the above-mentioned material, then it prevents penetration of chemical liquids and can therefore reduce the negative influence of the chemical liquid remaining in the release material cladding face.

The thermal shrinkage of the release material at the temperature of the thermal compression treatment is indispensably at most 1.5%, and is preferably at most 1.0%, more preferably from 0.01 to 0.96, even more preferably from 0.01 to 0.8%. When the thermal shrinkage is more than 1.5%, then the release material tends to readily shrink at a high temperature for solder resist curing (for example, at 160° C. or higher), and the cladding face may be thereby peeled. In other words, the heat resistance of the release material is poor.

The thermal shrinkage is determined as follows: The release material is treated in a drier at 180° C. for 1 hour, and its dimension is measured before and after the treatment using a three-dimensional measuring machine (by Mitsutoyo). The thermal shrinkage is (difference in dimension before and after heat treatment/dimension before heat treatment).

The reduction in elongation of the release material after the thermal compression treatment is preferably at most 50% thereof before the thermal compression treatment, more preferably at most 30%, even more preferably from 1 to 20%. When the elongation reduction is at most 50%, the release material may be prevented from being broken in peeling, and therefore it may keep good peelability.

The elongation reduction is determined as follows: Using a precision universal tester (by Shimadzu), the release material before the thermal compression treatment and the release material after the thermal compression treatment are individually pulled at a pulling rate of 5 mm/min, and the sample length L at break is measured. From the sample length $L_0$ before the test and the sample length L at break, the percentage elongation before the thermal compression treatment ($E_0$) and the percentage elongation after the thermal compression treatment (E) are computed according to the following formula (1).

$$\text{Percentage Elongation}(E, E_0)(\%) = (L - L_0) \times 100 / L_0 \qquad (1)$$

Next, the elongation reduction is computed according to the following formula (2).

$$\text{Elongation Reduction}(\%) = (E_0 - E) \times 100 / E_0 \qquad (2)$$

The resin material to constitute the release material includes polyphenylene sulfide, polyphenylene oxide, polysulfone, polyether sulfone, polyphenylene sulfone, polyether imide, polyimide, polyamidimide, polyamide, polycarbonate, polyarylate, polyether ketone, polyether ether ketone, polyacetal, cellulose acetate, poly-4-methylpentene-1, polyethylene terephthalate, polyethylene naphthalate, and derivatives of these resins. Above all, polyphenylene sulfide and polyimide are preferred.

In case where the release material is formed of a composite material of a combination of a resin material and a metal material, those mentioned above may be used for the resin material.

As the metal material, usable are stainless, brass and the like. The configuration of the composite material includes (a) a configuration where a film (e.g., ultrathin metal foil) or sheet of a metal material is formed on a film of a resin material by pressing, and (b) a configuration where a layer of a metal material is formed thereon by vapor deposition. For controlling the adhesiveness thereof, the surface of the release material may be roughened (matted). In this case, the thickness of the metal layer is preferably less than 1 μm. When the thickness is less than 1 μm, then chemical liquids would not penetrate to the depth even though the edges of the laminate are exposed to various chemical liquids in a production process for wiring boards, and therefore the negative influence of chemical liquids could be minimized.

When used as a composite material, the resin material may also be a fluororesin (polyvinylidene fluoride, polytetrafluoroethylene and the like) in addition to the above-mentioned ones.

The thickness of the release material is from 10 to 200 μm, preferably from 12 to 125 μm, more preferably from 40 to 125 μm. When the thickness is less than 10 μm, then the strength of the release material may be insufficient; and the release material may be broken when separated from the metal foil single-clad two-ply laminate, and the releasability thereof may be poor. If so, in addition, the handlability of the release material would be not good in constructing the metal foil single-clad two-ply laminate. When the thickness is more than 200 μm, it is unfavorable from the viewpoint of the availability and the cost.

If desired, two or more sheets of the release material may be combined for use herein within the range of the thickness mentioned above. Combining two or more sheets may facilitate the separation of the release material from the metal foil single-clad two-ply laminate.

(Metal Foil)

The metal foil may be any one usable in ordinary printed wiring boards, and is, for example, a copper foil. The copper foil may be any of an electrolytic copper foil or a rolled copper foil, and its thickness is not specifically defined. Accordingly, a copper foil having a thickness of at most 105 μm that is generally used in printed wiring boards, and a peelable copper foil can be used here.

In place of a peelable one, an etchable copper foil having an aluminium carrier or a nickel carrier is also usable here.

In general, the copper foil for use in printed wiring boards is roughened; and also in the present invention, the copper foil of the type is usable, or specifically the copper foil for use herein may not be roughened.

(Prepreg)

The prepreg is one produced by applying a matrix resin composition to a substrate through impregnation, coating or adhesion.

The material to constitute the substrate includes glass materials (E glass, D glass, S glass, T glass, quart glass and the like), ceramics (alumina, boron nitride and the like), heat-resistant engineering plastics (whole aromatic polyimide, polyphenylene sulfide, polyetherimide, polyimide, cell carbon), and the like; and one or more of these may be used here wither singly or as suitably combined. The configuration of the substrate includes a woven fabric or nonwoven fabric of fibers, chops or the like; an open-cellular porous fluororesin film or sheet; and the like.

The matrix resin as the main ingredient of the matrix resin composition for the prepreg includes phenolic resin, polyester resin, epoxy resin, cyanate resin, thermosetting polyimide resin, other thermosetting resins; composition of two or more of these; and the like.

An inorganic filler may be incorporated in the matrix resin composition for the prepreg, for enhancing the reliability thereof. Not specifically defined, the inorganic filler includes silica, fused silica, talc, alumina, aluminium hydroxide, bariums sulfate, calcium hydroxide, aerosil, calcium carbonate and the like. One or more of these may be used here either singly or as combined. From the viewpoint of the dielectric characteristics and the low thermal expansion thereof, silica is preferred.

For the purpose of enhancing the dispersibility thereof, the inorganic filler may be processed with various coupling agents such as silane coupling agent or the like.

A thermoplastic resin may be incorporated in the matrix resin composition for the prepreg, for enhancing the flexibility thereof. Examples of the thermoplastic resin include fluororesin, polyphenylene ether, modified polyphenylene ether, polyphenylene sulfide, polycarbonate, polyetherimide, polyether ether ketone, polyarylate, polyamide, polyamidimide, polybutadiene and the like, to which, however, the resin is not limited. One or more such thermoplastic resins may be used here either singly or as combined.

If desired, additives such as a coupling agent, a pigment, a leveling agent, a defoaming agent, an ion-trapping agent and the like may be incorporated in the matrix resin composition for the prepreg.

The number of the prepreg to constitute the metal foil single-clad laminate is at least one, but may be two or more. On one surface of the prepreg laminate after lamination, the above-mentioned metal foil is provided.

[2] Method for Producing Metal Foil Single-Clad Two-Ply Laminate:

The metal foil single-clad two-ply laminate of the present invention is produced as described below (see FIG. 1). Specifically, first, a metal foil 2 is superposed on one surface of a prepreg 1 (in case where two or more prepregs are laminated, the resulting laminate) to constitute a structure. Next, two pairs of the structures are prepared, and they are laminated through thermal compression via a release material 3 in the present invention put therebetween so that the prepregs face inward. For the thermal compression, for example, these materials are put between two mirror plates 4. In the present invention, the release material 3 has a length (size) same as or more than that of the prepreg 1 and the metal foil 2. From the viewpoint of operability in production of a printed wiring board, they are preferably the same.

The condition for thermal compression varies depending on the prepreg resin; and for example, in case where a glass cloth substrate/epoxy resin prepreg is used, preferably, the temperature is from 150 to 250° C. and the pressure is from 0.5 to 8.0 MPa.

[3] Single-Sided Printed Wiring Board and its Production Method:

The single-sided printed wiring board of the present invention is produced by processing both surfaces of the metal foil single-clad two-ply laminate of the present invention for circuit formation, solder resist application, Ni—Au plating and external configuration formation or for at least any one of those treatments, followed by separating the two pairs of metal foil single-clad laminates individually from the release material.

At the end of the series of those treatments, or as any additional treatment, the separated metal foil single-clad laminates may be inspected for bad fit connection (AOI inspection).

EXAMPLE 1

Two sheets of prepreg (Hitachi Chemical's GEA-679FGB, prepreg prepared by infiltrating an epoxy resin into a glass cloth substrate) having a thickness of 0.1 mm were sequentially laminated on a copper foil (Mitsui Kinzoku's 3EC-VLP-18) having a thickness of 18 μm to construct a structure, and two pairs of the structures were prepared. These were laminated on each other through thermal compression (pressing at 180° C. under 3 MPa for 1 hour) via a release material (release film) having a thickness of 50 μm put therebetween so that the prepregs could face inward, thereby producing a metal foil single-clad two-ply laminate.

The release material used here was a polyimide film by Ube Industries (trade name: Upilex-S), and its thermal shrinkage at 180° C. was 0.05%, and its elongation reduction after pressing was 5%. The copper foil, the glass cloth substrate/epoxy resin prepreg and the release material used here all had the same size of 510 mm×510 mm.

EXAMPLE 2

A metal foil single-clad two-ply laminate was produced in the same manner as in Example 1, for which, however, a film of Torelina having a thickness of 25 μm (Toray's polyphenylene sulfide film having a thermal shrinkage at 180° C. of 0.7% and having a reduction in elongation after pressing of 10%) was used as the release material.

EXAMPLE 3

A metal foil single-clad two-ply laminate was produced in the same manner as in Example 1, for which, however, a film of Torelina having a thickness of 75 μm (Toray's polyphenylene sulfide film having a thermal shrinkage at 180° C. of 0.5% and having a reduction in elongation after pressing of 18%) was used as the release material.

EXAMPLE 4

A metal foil single-clad two-ply laminate was produced in the same manner as in Example 1, for which, however, the thickness of the release material was 12.5 μm.

EXAMPLE 5

A metal foil single-clad two-ply laminate was produced in the same manner as in Example 1, for which, however, the thickness of the release material was 125 μm.

EXAMPLE 6

A metal foil single-clad two-ply laminate was produced in the same manner as in Example 1, for which, however, MAQINAS having a thickness of 38 μm (Nippon Mining Metals' polyimide resin film coated with copper by vapor deposition in a thickness of 0.3 μm, having a thermal shrinkage at 180° C. of 0.1% and having a reduction in elongation after pressing of was used as the release material.

EXAMPLE 7

A metal foil single-clad two-ply laminate was produced in the same manner as in Example 1, for which, however, a film produced by coating the surface of a film of Aflex having a thickness of 25 μm (Asahi Glass's fluororesin film having a thermal shrinkage at 180° C. of 2.0% and having a reduction in elongation after pressing of 10%) with copper by vapor deposition in a thickness of 0.3 μm (having a thermal shrinkage at 180° C. of 0.5% and having a reduction in elongation after pressing of 10%) was used as the release material.

EXAMPLE 8

A metal foil single-clad two-ply laminate was produced in the same manner as in Example 1, for which, however, a Neotex film having a thickness of 50 μm (Teijin DuPont's polyethylene naphthalate film having a thermal shrinkage at 180° C. of 1.5% and having a reduction in elongation after pressing of 8%) was used as the release material.

COMPARATIVE EXAMPLE 1

A metal foil single-clad two-ply laminate was produced in the same manner as in Example 1, for which, however, an Aflex film having a thickness of 25 μm (Asahi Glass's fluororesin film having a thermal shrinkage at 180° C. of 2.0% and having a reduction in elongation after pressing of 10%) was used as the release material.

COMPARATIVE EXAMPLE 2

A metal foil single-clad two-ply laminate was produced in the same manner as in Example 1, for which, however, a Lumirror film having a thickness of 4.5 μm (Toray's polyester film having a thermal shrinkage at 180° C. of 0.5% and having a reduction in elongation after pressing of 60%) was used as the release material.

COMPARATIVE EXAMPLE 3

A metal foil single-clad two-ply laminate was produced in the same manner as in Example 1, for which, however, the thickness of the release material was 7.5 μm.

COMPARATIVE EXAMPLE 4

A metal foil single-clad two-ply laminate was produced in the same manner as in Example 1, for which, however, Sepanium having a thickness of 40 μm (made of aluminium by Sun Aluminium, having a thermal shrinkage at 180° C. of 0.06 and having a reduction in elongation after pressing of 0%) was used as the release material.

The metal foil single-clad two-ply laminates produced in Examples 1 to 8 and Comparative Examples 1 to 4 were processed according to the procedures (1) to (3) mentioned below, and evaluated as in (A) to (C) mentioned below. The test results are shown in Table 2.

(1) Circuit Formation Treatment:

The periphery of the metal foil single-clad two-ply laminate obtained in Examples and Comparative Examples was cut off into a size of 500 mm×500 mm. Next, in this condition, both surfaces of the piece were laminated with a dry film (Hitachi Chemical's H-K425 (trade name)), then exposed to light, developed, washed with water, etched and washed with water in that order for circuit formation thereon.

(2) Solder Resist Application Treatment:

The metal foil single-clad two-ply laminate that had been processed for circuit formation thereon was coated with a solder resist (Hitachi Chemical's SR-7200G) through screen-printing thereon in a final thickness of 25 μm, and dried at 80° C. for 30 minutes. Next, this was exposed to light at 500 mJ/cm$^2$, and then developed with an aqueous 1% sodium hydrogencarbonate solution at 30° C. for 3 minutes. Subsequently, this was washed with running water, and cured under heat at 170° C. for 60 minutes.

(3) Ni—Au Plating Treatment:

Next, the metal foil single-clad two-ply laminate was processed according to the procedures of various treatments a) to q) sequentially in that order, as in Table 1 given below

[Table 1]

TABLE 1

| Step | Solution (material) | Concentration | Liquid Temperature (° C.) | Dipping Time (min) |
|---|---|---|---|---|
| a) degreasing | Z-200 | — | 60 | 1 |
| b) washing with water | — | — | 25 | 2 |
| c) soft etching | ammonium persulfate | 100 g/L | 25 | 1 |
| d) washing with water | — | — | 25 | 2 |
| e) washing with acid | sulfuric acid | 10 vol. % | 25 | 1 |
| f) washing with water | — | — | 25 | 2 |
| g) activation treatment | SA-100 | — | 25 | 5 |
| h) washing with water | — | — | 25 | 2 |
| i) electroless nickel phosphorus plating | NIPS-100 | — | 85 | 20 |
| j) washing with water | — | — | 25 | 2 |
| k) electroless nickel boron plating | Topchemialloy 66 | — | 65 | 5 |
| l) washing with water | — | — | 25 | 2 |
| m) electroless palladium plating | Pallet | — | 70 | 5 |
| n) washing with water | — | — | 25 | 2 |
| o) immersion gold | HGS-100 | — | 85 | 10 |
| p) washing with water | — | — | 25 | 2 |
| q) electroless gold plating | HGS-2000 | — | 65 | 40 |

The details of the materials shown for the solution in Table 1 are as follows;
Z-200: by World Metal
SA-100: by Hitachi Chemical
NIPS-100: by Hitachi Chemical
Topchemialloy 66: by Okuno Chemical
Pallet: by Kojima Chemical
HGS-100: by Hitachi Chemical
HGS-2000: by Hitachi Chemical (A) Evaluation of Releasability:

After processed as in the above, the two pairs of metal foil single-clad laminates were separated from the release material, and their releasability was checked. In Table 2 "○○" means that there was no problem in peeling from the release material; "○" means that there was little problem in peeling from the release material; and "×" means that a part of the release material was broken in peeling. The samples with "○○" and "○" showed good releasability with no problem in practical use.

(B) Evaluation of Chemical Penetration:

After processed as in the above, the two pairs of metal foil single-clad laminates were separated from the release material, and visually checked as to whether or not the chemicals (solutions used in the treatments) had penetrated into the cladding face of the release material.

(C) Evaluation of Heat Resistance:

In the solder resist application treatment, the cladding face was checked for the presence or absence of peeling at the part of the solder resist thermally cured at 170° C. In Table 2 "○○" means that there was no peeling at the cladding face and the heat resistance was extremely good; "○" means that there was no peeling at the cladding face and the heat resistance was good; and "×" means that there occurred peeling at the cladding face and the heat resistance was poor.

[Table 2]

TABLE 2

| | Thickness of Release Material (μm) | Thermal Shrinkage | Elongation Reduction after pressing | Releasability | Chemical Penetration | Heat Resistance |
|---|---|---|---|---|---|---|
| Example 1 | 50 | 0.05% | 5% | ○○ | no penetration | ○○ |
| Example 2 | 25 | 0.7% | 8% | ○ | no penetration | ○○ |
| Example 3 | 75 | 0.5% | 18% | ○○ | no penetration | ○○ |
| Example 4 | 12.5 | 0.05% | 5% | ○ | no penetration | ○○ |
| Example 5 | 125 | 0.05% | 5% | ○○ | no penetration | ○○ |
| Example 6 | 38 | 0.1% | 5% | ○ | no penetration | ○○ |
| Example 7 | 25 | 0.5% | 10% | ○ | o penetration | ○○ |
| Example 8 | 50 | 1.5% | 8% | ○○ | no penetration | ○ |
| Comparative Example 1 | 25 | 2.0% | 10% | ○ | no penetration | x |
| Comparative Example 2 | 4.5 | 0.5% | 60% | broken | no penetration | ○○ |
| Comparative Example 3 | 7.5 | 0.05% | 5% | broken | no penetration | ○○ |
| Comparative Example 4 | 40 | 0.0% | 0% | ○ | penetration occurred | ○○ |

As in Table 2, the samples produced in Examples 1 to 8 were all good in point of the releasability, the chemical penetration resistance and the heat resistance, and could be processed through all the procedures with no problem. In addition, in the subsequent step of separating the two-ply laminate into the individual two sheets, there occurred no problem.

On the other hand, in Comparative Example 1, the thermal shrinkage of the release material was great, and therefore there occurred peeling at the cladding face at a high temperature. In Comparative Example 2, the elongation after pressing greatly reduced, and therefore, in separating the metal foil single-clad two-ply laminate, the release material was broken and the individual sheets could not be well separated. In Comparative Example 3, the release material was extremely thin and its strength was low, and therefore, the release material was broken in separating the laminate. In Comparative Example 4, the release material was metal, and therefore chemicals penetrated into the cladding face and the release material dissolved a little.

The invention claimed is:

1. A metal foil single-clad two-ply laminate which comprises two pairs of structures each comprising one prepreg, or a laminate of two or more prepregs, cladded with a metal foil on one surface thereof, wherein the two pairs of structures are laminated on each other through thermal compression via a release material put therebetween so that each prepreg faces inward, prepregs of the two pairs of structures being adjacent the release material, wherein the release material is a film of a composite material of a resin material combined with a metal material, the metal material being a metal material other than aluminum, a thickness of the release material is from 10 to 200 μm, and the thermal shrinkage of the release material at the temperature of the thermal compression treatment is in the range of 0.05 to 1.5%, wherein the resin material is selected from a resin material group consisting of polyphenylene sulfide, polyphenylene oxide, polysulfone, polyether sulfone, polyphenylene sulfone, polyether imide, polyimide, polyamideimide, polyamide, polycarbonate, polyarylate, polyether ketone, polyether ether ketone, polyacetal, cellulose acetate, poly-4-methylpentene-1, polyethylene terephthalate, and polyethylene naphthalate, and wherein said release material has a property that the release material can be separated from the prepregs, of the two pairs of structures, that are adjacent to the release material.

2. The metal foil single-clad two-ply laminate according to claim 1, wherein the reduction in elongation of the release material after the thermal compression treatment is at most 50% thereof before the thermal compression treatment.

3. A method for producing a metal foil single-clad two-ply laminate, which comprises cladding one prepreg, or a laminate of two or more prepregs, with a metal foil on one surface thereof to prepare a structure, and laminating two pairs of the structure on each other through thermal compression via a release material put therebetween so that each prepreg faces inward, prepregs of the two pairs of the structure being adjacent the release material, wherein the release material is a film of a resin material, or of a composite material of a resin material combined with a metal material, the metal material being a metal material other than aluminum, a thickness of the release material is from 10 to 200 μm, and the thermal shrinkage of the release material at the temperature of the thermal compression treatment is in the range of 0.05 to 1.5%, wherein the resin material of the film of the resin material, or of the resin material combined with the metal material, is selected from a resin material group consisting of polyphenylene sulfide, polyphenylene oxide, polysulfone, polyether sulfone, polyphenylene sulfone, polyether imide, polyimide, polyamideimide, polyamide, polycarbonate, polyarylate, polyether ketone, polyether ether ketone, polyacetal, cellulose acetate, poly-4-methylpentene-1, polyethylene terephthalate, and polyethylene naphthalate, and wherein said release material has a property that the release material can be separated from the prepregs, of the two pairs of the structure, that are adjacent to the release material.

4. A single-sided printed wiring board produced by processing both surfaces of the metal foil single-clad two-ply laminate according to claim 1, for circuit formation, solder resist application, Ni—Au plating and external configuration formation or for at least any one of those treatments, followed by separating the two pairs of metal foil single-clad laminates individually from the release material.

5. A method for producing a single-sided printed wiring board, which comprises processing both surfaces of the metal foil single-clad two-ply laminate according to claim 1, for circuit formation, solder resist application, Ni—Au plating and external configuration formation or for at least any one treatment of those treatments, followed by separating the two pairs of metal foil single-clad laminates individually from the release material.

6. A single-sided printed wiring board produced by processing both surfaces of the metal foil single-clad two-ply laminate according to claim 2, for circuit formation, solder resist application, Ni—Au plating and external configuration formation or for at least any one of those treatments, followed by separating the two pairs of metal foil single-clad laminates individually from the release material.

7. A method for producing a single-sided printed wiring board, which comprises processing both surfaces of the metal foil single-clad two-ply laminate according to claim 2, for circuit formation, solder resist application, Ni—Au plating and external configuration formation or for at least any one treatment of those treatments, followed by separating the two pairs of metal foil single-clad laminates individually from the release material.

8. The metal foil single-clad two-ply laminate according to claim 2, wherein said reduction in elongation of the release material after the thermal compression treatment is in the range of 1 to 20%.

9. The metal foil single-clad two-ply laminate according to claim 1, wherein said resin material is selected from the group consisting of polyphenylene sulfide and polyimide.

10. The metal foil single-clad two-ply laminate according to claim 1, wherein the thickness of the release material film is 12 to 125 μm.

11. The metal foil single-clad two-ply laminate according to claim 2, wherein the reduction in elongation of the release material after the thermal compression treatment is from 1 to 50% thereof before the thermal compression treatment.

12. The method according to claim 3, wherein the reduction in elongation of the release material after the thermal compression treatment is at most 50% thereof before the thermal compression treatment.

13. The method according to claim 12, wherein the reduction in elongation of the release material after the thermal compression treatment is from 1 to 50% thereof before the thermal compression treatment.

14. The method according to claim 3, wherein the release material is the composite material which is a combination of a film consisting of the resin material, and the metal material.

15. The metal foil single-clad two-ply laminate according to claim 2, wherein said thickness of the release material is 12 to 125 μm and said reduction in elongation after the thermal compression treatment is 5 to 18%.

16. The metal foil single-clad two-ply laminate according to claim 1, wherein said metal material is selected from the group consisting of stainless steel, brass and copper.

17. The metal foil single-clad two-ply laminate according to claim 1, wherein the metal material is brass or copper.

18. The metal foil single-clad two-ply laminate according to claim 1, wherein the two pairs of structures are directly laminated to the release material.

19. The method according to claim 3, wherein said metal material is selected from the group consisting of stainless steel, brass and copper.

20. The method according to claim 3, wherein the metal material is brass or copper.

21. The method according to claim 3, wherein the release material consists of the film of the resin material, and the two pairs of the structure are directly laminated to the release material.

22. The metal foil single-clad two-ply laminate according to claim 1, wherein the resin material is selected from the resin material group consisting of polyphenylene sulfide, polyphenylene oxide, polysulfone, polyether sulfone, polyphenylene sulfone, polyether imide, polyamideimide, polyamide, polycarbonate, polyarylate, polyether ketone, polyether ether ketone, polyacetal, cellulose acetate, poly-4-methylpentene-1, polyethylene terephthalate, and polyethylene naphthalate.

23. The method according to claim 3, wherein the resin material of the film of the resin material is selected from the resin material group consisting of polyphenylene sulfide, polyphenylene oxide, polysulfone, polyether sulfone, polyphenylene sulfone, polyether imide, polyamideimide, polyamide, polycarbonate, polyarylate, polyether ketone, polyether ether ketone, polyacetal, cellulose acetate, poly-4-methylpentene-1, polyethylene terephthalate, and polyethylene naphthalate.

24. The metal foil single-clad two-ply laminate according to claim 1, wherein the metal material has a thickness of less than 1 μm.

25. The method according to claim 3, wherein said release material is the film consisting of the resin material, or the film of the composite material of a combination of a film consisting of the resin material, and the metal material having a thickness of less than 1 μm.

26. The metal foil single-clad two-ply laminate according to claim 1, wherein said release material has additional properties (1) that chemicals used in a production process for processing both surfaces of the metal foil single-clad two-ply laminate for circuit formation, solder resist application, Ni—Au plating and external configuration formation do not penetrate between the release material and the prepregs of the two pairs of structures adjacent to the release material, and (2) that there is no peeling at an interface between the two pairs of said structures and the release material during said production process.

27. The single sided printed wiring board according to claim 4, wherein said release material has additional properties (1) that chemicals used in a production process for processing both surfaces of the metal foil single-clad two-ply laminate for circuit formation, solder resist application, Ni—Au plating and external configuration formation do not penetrate between the release material and the prepregs of the two pairs of structures adjacent to the release material, and (2) that there is no peeling at an interface between the two pairs of said structures and the release material during said production process.

28. The method according to claim 3, wherein the release material has additional properties (1) that chemicals used in a production process for processing both surfaces of the metal foil single-clad two-ply laminate for circuit formation, solder resist application, Ni—Au plating and external configuration formation do not penetrate between the release material and the prepregs of the two pairs of the structure adjacent to the release material, and (2) that there is no peeling at an interface between the two pairs of the structure and the release material during said production process.

29. The method for producing a single-sided printed wiring board according to claim 5, wherein said release material has additional properties (1) that chemicals used in a production process for processing both surfaces of the metal foil single-clad two-ply laminate for circuit formation, solder resist application, Ni—Au plating and external configuration formation do not penetrate between the release material and the prepregs of the two pairs of structures adjacent to the release material, and (2) that there is no peeling at an interface between the two pairs of said structures and the release material during said production process.

* * * * *